United States Patent
Pei

(10) Patent No.: US 7,416,931 B2
(45) Date of Patent: Aug. 26, 2008

(54) METHODS FOR FABRICATING A STRESS ENHANCED MOS CIRCUIT

(75) Inventor: Gen Pei, Yorktown Heights, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 67 days.

(21) Appl. No.: 11/466,383

(22) Filed: Aug. 22, 2006

(65) Prior Publication Data
US 2008/0124877 A1 May 29, 2008

(51) Int. Cl.
*H01L 21/336* (2006.01)

(52) U.S. Cl. ............. 438/197; 438/585; 438/285; 438/300; 257/E21.317; 257/E21.444; 257/E21.621; 257/E21.633; 257/E21.634

(58) Field of Classification Search ......... 438/197, 438/582, 183, 285, 300, 585; 257/E21.317, 257/E21.444, E21.621, E21.633, E21.634
See application file for complete search history.

(56) References Cited

U.S. PATENT DOCUMENTS

| | | | |
|---|---|---|---|
| 7,164,163 B2 | 1/2007 | Chen et al. | |
| 7,214,629 B1 * | 5/2007 | Luo et al. | 438/778 |
| 7,271,045 B2 * | 9/2007 | Prince et al. | 438/199 |
| 2005/0116360 A1 | 6/2005 | Huang et al. | |
| 2006/0024879 A1 | 2/2006 | Fu et al. | |
| 2006/0160317 A1 | 7/2006 | Zhu et al. | |
| 2006/0220113 A1 | 10/2006 | Tamura et al. | |
| 2006/0286729 A1 * | 12/2006 | Kavalieros et al. | 438/183 |
| 2007/0045747 A1 | 3/2007 | Kohyama | |
| 2007/0099414 A1 | 5/2007 | Frohberg et al. | |
| 2007/0108526 A1 | 5/2007 | Kohyama | |
| 2007/0138570 A1 | 6/2007 | Chong et al. | |
| 2007/0246776 A1 | 10/2007 | Moroz et al. | |
| 2008/0014704 A1 | 1/2008 | Peidous et al. | |

* cited by examiner

*Primary Examiner*—Matthew S. Smith
*Assistant Examiner*—Julio J. Maldonado
(74) *Attorney, Agent, or Firm*—Ingrassia Fisher & Lorenz, P.C.

(57) ABSTRACT

Methods are provided for fabricating a stress enhanced MOS circuit. One method comprises the steps of depositing a stressed material overlying a semiconductor substrate and patterning the stressed material to form a stressed dummy gate electrode overlying a channel region in the semiconductor substrate so that the stressed dummy gate induces a stress in the channel region. Regions of the semiconductor substrate adjacent the channel are processed to maintain the stress to the channel region and the stressed dummy gate electrode is replaced with a permanent gate electrode.

17 Claims, 4 Drawing Sheets

METHODS FOR FABRICATING A STRESS ENHANCED MOS CIRCUIT

TECHNICAL FIELD

The present invention generally relates to methods for fabricating MOS circuits, and more particularly relates to replacement gate methods for fabricating stress enhanced MOS circuits.

BACKGROUND

The majority of present day integrated circuits (ICs) are implemented by using a plurality of interconnected field effect transistors (FETs), also called metal oxide semiconductor field effect transistors (MOSFETs), or simply MOS transistors. An MOS transistor includes a gate electrode as a control electrode and spaced apart source and drain regions between which a current can flow. A control voltage applied to the gate electrode controls the flow of current through a channel between the source and drain regions.

The gain of an MOS transistor, usually defined by the transconductance ($g_m$), is proportional to the mobility ($\mu$) of the majority carrier in the transistor channel. The current carrying capability and hence the performance of an MOS transistor is proportional to the mobility of the majority carrier in the channel. The mobility of holes, the majority carrier in a P-channel MOS (PMOS) transistor, and the mobility of electrons, the majority carrier in an N-channel MOS (NMOS) transistor, can be increased by applying an appropriate stress to the channel. The known stress engineering methods greatly enhance circuit performance by increasing device drive current without increasing device size and device capacitance. However, as technology is scaled down and as each device in the IC and each element of each device is reduced in size, the volume of stress sources becomes smaller and smaller, which makes using strain engineering to enhance device performance more and more challenging.

Accordingly, it is desirable provide a method for fabricating a stress enhanced MOS transistor. In addition, it is desirable to provide a method for fabricating a stress enhanced MOS transistor by a process of memorizing or maintaining the stress introduced into the transistor channel by a stressed dummy gate electrode. Furthermore, other desirable features and characteristics of the present invention will become apparent from the subsequent detailed description and the appended claims, taken in conjunction with the accompanying drawings and the foregoing technical field and background.

BRIEF SUMMARY

Methods are provided for fabricating a stress enhanced MOS circuit. One method comprises the steps of depositing a stressed material overlying a semiconductor substrate and patterning the stressed material to form a stressed dummy gate electrode overlying a channel region in the semiconductor substrate so that the stressed dummy gate induces a stress in the channel region. Regions of the semiconductor substrate adjacent the channel are processed to maintain the stress to the channel region and the stressed dummy gate electrode is replaced with a permanent gate electrode.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
FIG. 1 shows in table form the mobility change resulting from a stress applied to the channel of an MOS transistor in various directions.

FIG. 1 shows the mobility change resulting from a stress of 1 Giga Pascal (GPa) applied to the channel of an MOS transistor in various directions. The results shown in the figure apply to an MOS transistor channel formed in a (100) silicon wafer and oriented in a [110] crystal direction. Columns 18 and 19 relate to the application of a tensile stress applied to the channel of an NMOS transistor and a PMOS transistor, respectively. In like manner columns 20 and 21 relate to the application of a compressive stress applied to the channel of an NMOS transistor and a PMOS transistor, respectively. Row 22 indicates the result of application of the stress in the longitudinal direction along the channel length; row 23 indicates the result of application of the stress in the transverse direction along the channel width; and row 24 indicates the result of application of the stress in a direction perpendicular to the plane of the channel. It is readily apparent that application of a stress, either tensile or compressive, applied to the channel of an MOS transistor can either enhance or degrade the majority carrier mobility depending on the direction of application of the stress and whether the majority carrier is a hole or an electron.

FIGS. 2-10 illustrate, in cross section, method steps for fabricating a stress enhanced MOS circuit 30 and specifically one exemplary MOS transistor 32 of that circuit in accordance with various embodiments of the invention. Each embodiment of the invention employs a stress mechanism to induce a stress into the transistor channel. The stress is memorized or fixed in the channel so that the stress remains even after the stress mechanism is removed. In accordance with some embodiments of the invention additional stress mechanisms can subsequently be used to further increase the channel strain. In these illustrative embodiments the exemplary MOS transistor is a stress enhanced N-channel MOS (NMOS) transistor, although similar method steps can be used to manufacture a stress enhanced P-channel MOS (PMOS) transistor as will be explained below. Likewise, similar method steps can used to manufacture stress enhanced complementary MOS (CMOS) circuits that use a plurality of stress enhanced NMOS and/or PMOS transistors with or without conventional MOS transistors coupled together to implement a desired integrated circuit function. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 2:
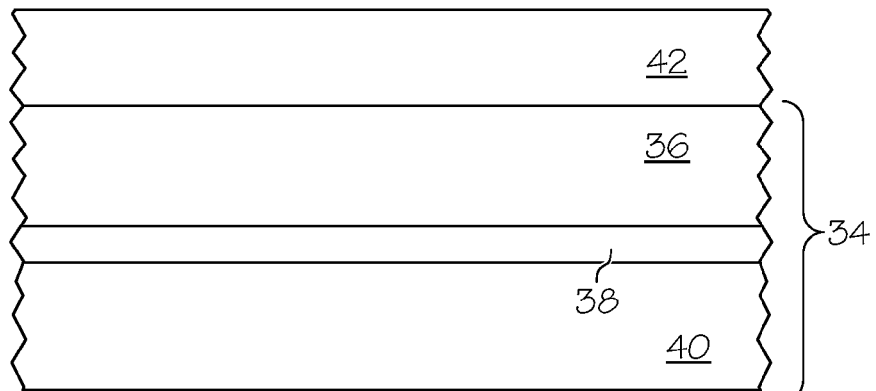
FIGS. 2-10 illustrate, in cross section method steps for fabricating a stress enhanced MOS circuit in accordance with various embodiments of the invention.

The method in accordance with one embodiment of the invention begins as illustrated in FIG. 2 with the provision of a semiconductor substrate 34. The semiconductor substrate is preferably a silicon substrate having a (100) surface crystal orientation wherein the term "silicon substrate" is used herein to encompass the relatively pure silicon materials typically used in the semiconductor industry as well as silicon admixed with other elements such as germanium, carbon, and the like. Alternatively, the semiconductor substrate can be germanium, gallium arsenide, or other semiconductor material. Semiconductor substrate 34 will hereinafter be referred to for convenience but without limitation as a silicon substrate. Silicon substrate 34 may be a bulk silicon wafer (not illustrated), or may be a thin layer of silicon 36 on an insulating layer 38 (commonly know as silicon-on-insulator or SOI) that, in turn, is supported by a carrier wafer 40. Thin silicon layer 36 typically has a thickness of about 20-100 nanometers (nm) depending on the circuit function being implemented, and preferably has a thickness of about 40-60 nm. A layer 42 of stressed dummy gate electrode material is deposited overlying silicon layer 36. For fabricating an NMOS transistor, layer 42 is deposited as a compressive stressed layer. Preferably layer 42 is a layer of titanium nitride having a compressive stress of at least about −2.5 GPa and most preferably a compressive stress of about −10 GPa. For fabricating a PMOS transistor the stressed dummy gate electrode material is deposited as a tensile stressed layer. Compressive stressed titanium nitride or other stressed materials can be deposited by well known chemical vapor deposition techniques. Preferably the stressed dummy gate electrode material is deposited directly on silicon layer 36 so that maximum stress is transferred to the silicon. A thin layer, for example a thin layer of silicon dioxide, can also be formed on the surface of silicon layer 36 before the deposition of the stressed dummy gate electrode forming material to avoid a reaction between the material and the silicon, but the intervening layer should be kept as thin as possible so as not to significantly reduce the transfer of stress to the silicon.

Figure 3:
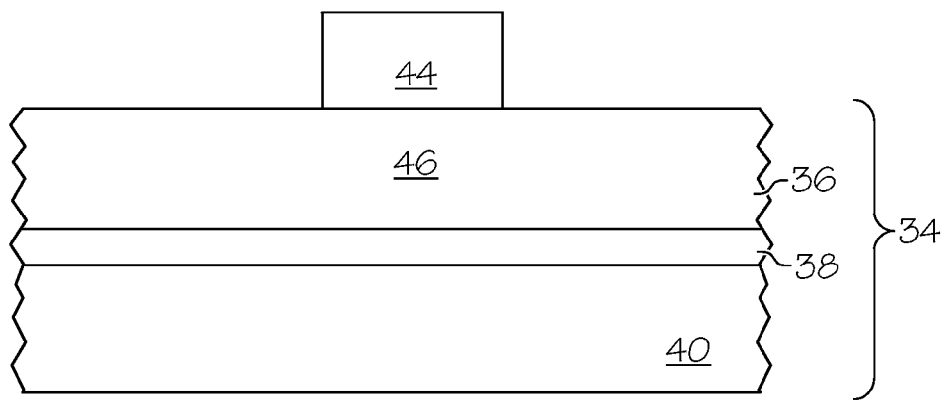

As illustrated in FIG. 3, layer 42 of stressed dummy gate electrode material is patterned and etched to form a dummy gate electrode 44 overlying a channel 46 at the surface of thin silicon layer 36. For an NMOS transistor the dummy gate electrode formed of a compressive stressed material induces a tensile stress in channel 46. For a PMOS transistor the dummy gate electrode formed of a tensile stressed material induces a compressive stress in the channel. As many processing steps as possible, especially thermal processing steps, that might cause a relaxation of the stress in the stressed material or the induced stress in the channel are preferably carried out before the deposition and patterning of the stressed material. For example, although not illustrated in the figure, before the deposition and patterning of layer 42 shallow trench isolation (STI) or other forms of electrical isolation may be formed in the semiconductor substrate to provide electrical isolation between transistors. Additionally, at least the initial steps for fabricating conventional, unstressed MOS transistors may be carried out before the deposition and patterning of layer 42.

Figure 4:
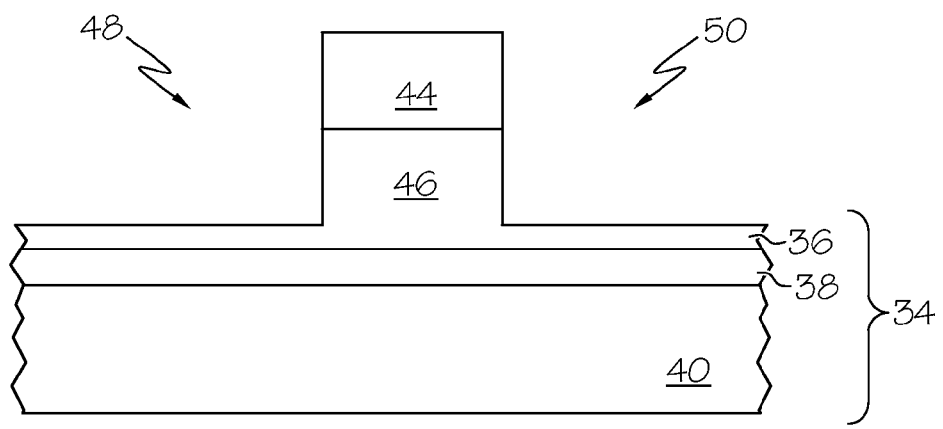
Figure 5:
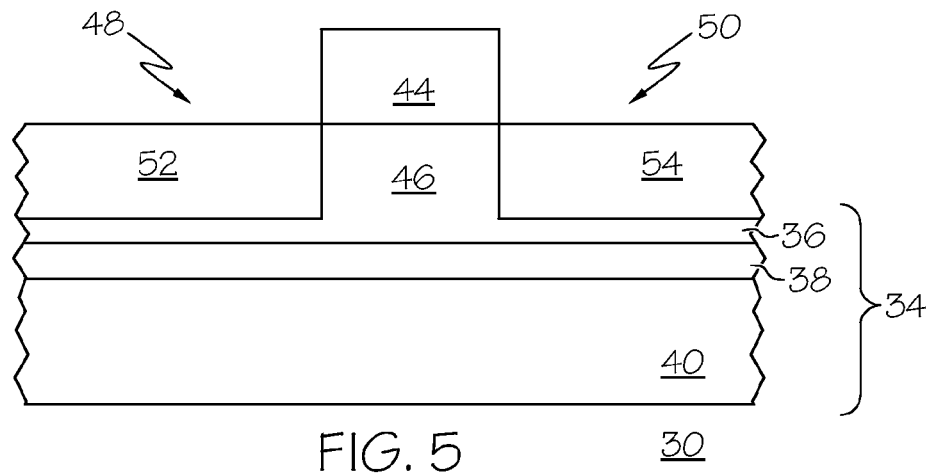
Figure 6:
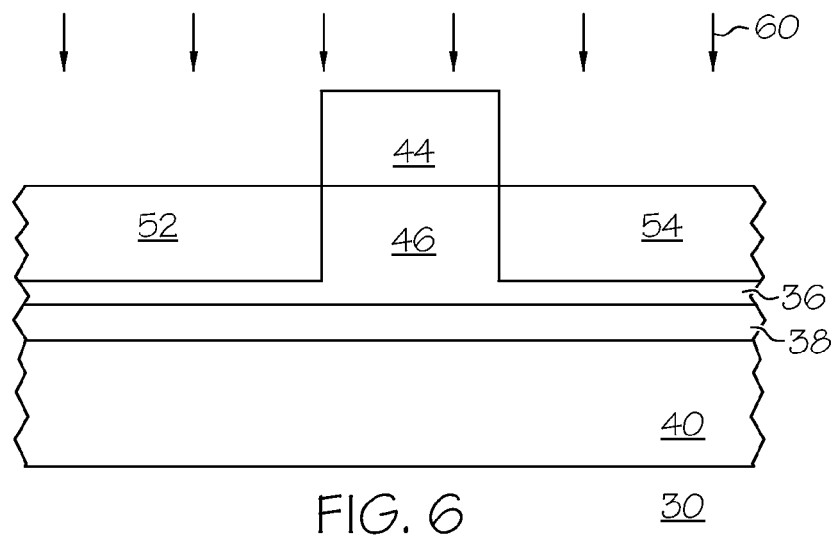

In accordance with the invention, method steps are taken to process the source and drain regions of the MOS transistor after patterning the dummy gate electrode to memorize, that is, to fix or maintain the stress induced in the channel. In accordance with one embodiment of the invention, as illustrated in FIGS. 4 and 5, the stress is memorized by etching back the source and drain regions of the MOS transistor and regrowning those regions by selective epitaxial growth (SEG). In accordance with an alternate embodiment of the invention, as illustrated in FIG. 6, the stress is memorized by amorphizing and then recrystallizing the source and drain regions. After the stress is memorized in the channel, the dummy gate electrode can be replaced by a permanent gate electrode.

When dummy gate electrode material with a compressive stress is patterned to form the dummy gate electrode, the compressive stress within the dummy gate will make it expand, which will try to stretch lattice of the silicon film underneath it. The silicon film underneath the dummy gate electrode therefore will have a tensile stress. The tensile stress in the channel will cause the channel silicon to try to expand against the silicon in the source and drain regions, in turn causing a compressive stress in those regions. The tensile stress in the channel thus is balanced by the compressive stress in the source and drain regions. If the compressive gate electrode is removed before the inventive source and drain processing in accordance with the invention, the stress in the source and drain regions and the channel region will rebalance and those regions will become stress free. By processing the source and drain regions in accordance with embodiments of the invention the silicon in the source and drain regions is regrown or recrystallized using the silicon lattice far way from the channel as a template, and that silicon lattice is stress free. The regrown or recrystallized silicon of the source and drain regions is therefore stress free. After the dummy gate electrode is subsequently removed, the stress in the source and drain regions and in the channel region will rebalance and the channel will be tensile stressed to enhance the mobility of majority carrier electrons. Similarly if the dummy gate electrode is formed of a tensile stressed material, as would be used for a PMOS transistor, the same principle applies except that tensile and compressive stresses are interchanged and the channel will be compressive stressed to enhance the mobility of majority carrier holes.

As illustrated in FIG. 4, in accordance with one embodiment of the invention, trenches 48 and 50 are etched into thin silicon layer 36 in the source and drain regions on opposite sides of dummy gate electrode 44 and adjacent channel 46. Either the dummy gate electrode or the mask used to pattern the dummy gate electrode can be used as an etch mask for the trench etching. The trenches are thus self aligned with the dummy gate electrode and with channel 46. The trenches can be etched into the thin silicon layer by an anisotropic plasma etch such as a reactive ion etch using a chlorine or hydrogen bromide/oxygen chemistry. The source 52 and drain 54 regions can be regrown by the well known process of selective epitaxial growth as illustrated in FIG. 5. The source and drain regions can be in situ doped during the selective epitaxial growth by incorporating an N-type dopant such as arsenic or phosphorous into the reactant flow. In fabricating a PMOS transistor a P-type dopant such as boron would be incorporated into the reactant flow. By in situ doping the epitaxial material, the source and drain regions need not be subsequently impurity doped by ion implantation. Ion implantation can cause damage to the silicon lattice resulting in a reduction in the lattice strain.

In accordance with the alternate embodiment of the invention, as illustrated in FIG. 6, ions are implanted into thin silicon layer 36 adjacent dummy gate electrode 44 as indicated by arrows 60 to amorphize the silicon adjacent the channel region in the areas in which the source 52 and drain 54 regions will be formed. The implantation can be masked by the dummy gate electrode and/or the masking layer used to pattern the dummy gate electrode. The selected regions of the silicon layer are amorphized, in known manner, by implanting neutral ions such as silicon or argon ions at a sufficient energy and dose to break down the regular crystal lattice. Following the amophizing implantation, the implanted source and drain regions of the thin silicon layer are thermally annealed to cause the source and drain regions to recrystallize as monocrystalline silicon.

Figure 7:
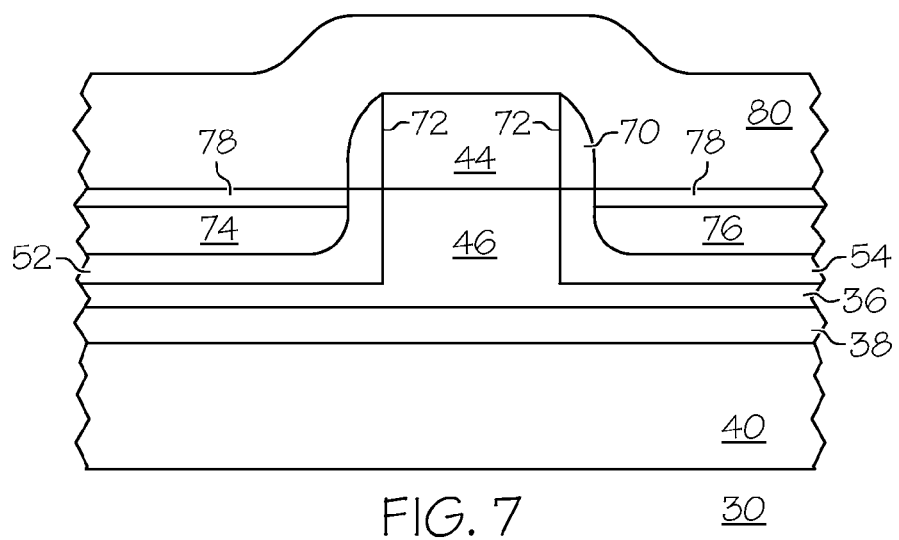

Following either the selective epitaxial growth or the recrystallization the method in accordance with an embodiment of the invention continues as illustrated in FIG. 7. Side wall spacers 70 are formed on the side walls 72 of dummy gate electrode 44. The side wall spacers can be formed in conventional manner by depositing a layer of side wall spacer forming material such as a silicon oxide, silicon nitride, silicon oxynitride, or the like. The sidewall spacer forming material is anisotropically etched, for example by reactive ion etching to leave the spacers on the vertical side walls of the dummy gate electrode. The dummy gate electrode and the side wall spacers are used as an implantation mask and conductivity determining ions are implanted into thin silicon layer 36 and specifically into source 52 and drain 54 regions to form the source 74 and drain 76 of the MOS transistor. For an NMOS transistor the implanted ions are Group V ions such as phosphorous or arsenic ions and for a PMOS transistor the implanted ions are Group III ions such as boron ions. The side wall spacers can also be used as a mask to form self aligned metal silicide contacts 78 to the source and drain. The metal silicide contacts are formed by depositing a silicide forming metal such as nickel or cobalt and heating the metal to cause the metal to react with exposed silicon to form a metal silicide. The metal that is not in contact with silicon, such as the metal contacting the side wall spacers, does not react and can be easily removed by wet etching in a $H_2O_2/H_2SO_4$ or $HNO_3/HCl$ solution. In accordance with one embodiment of the invention, after the step of forming metal silicide contacts, a stress liner layer 80 is blanket deposited overlying the dummy gate electrode, side wall spacers, and the source and drain regions. The stress liner is formed of an electrically insulating material and can be, for example, a layer of stressed silicon nitride. The layer of silicon nitride can be deposited, for example, by LPCVD or PECVD from reactants including dichlorosilane and ammonia. The deposition conditions, reactants, and reactant flows can be adjusted, as is well known, to deposit either a tensile stress liner or a compressive stress liner. The stress liner layer is deposited as a tensile stressed layer for an NMOS transistor and as a compressive stressed layer for a PMOS transistor. Although not illustrated, an additional insulating layer may be deposited over the stress liner layer to fill the gap between adjacent gate electrodes.

Figure 8:
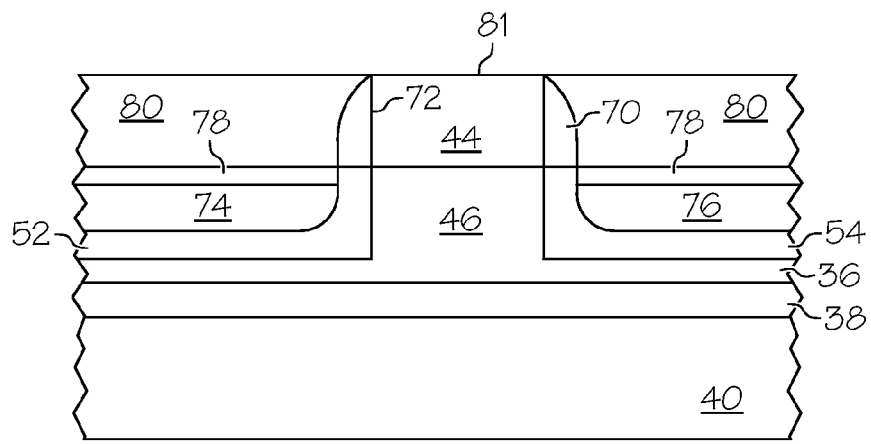
Figure 9:
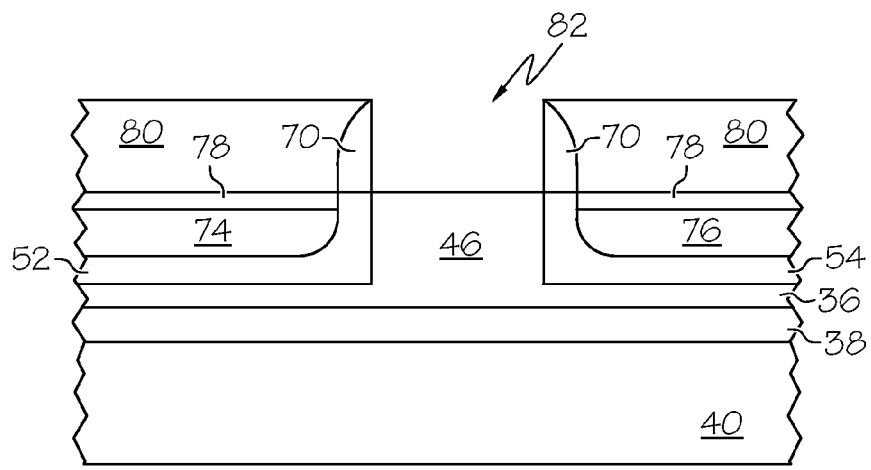

A portion of stress liner layer 80 is removed to expose top 81 of dummy gate electrode 44 as illustrated in FIG. 8. The portion of stress liner layer 80 can be removed, for example, by chemical mechanical polishing (CMP). The dummy gate electrode 44 is removed by etching to leave a void 82 bounded by side wall spacers 70 and stress liner layer 80 as illustrated in FIG. 9.

Figure 10:
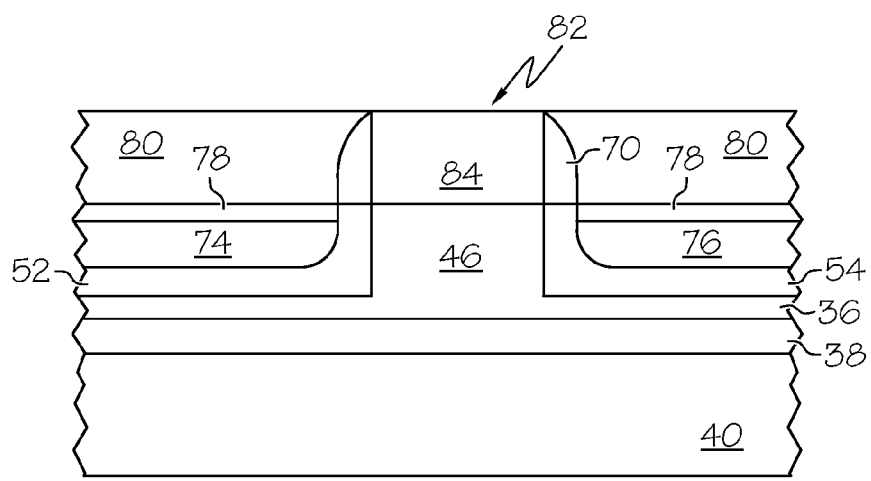

As illustrated in FIG. 10, the method in accordance with an embodiment of the invention continues by filling void 82 with polycrystalline silicon or other gate electrode forming material. Polycrystalline silicon can be deposited, for example, by the reduction of silane ($SiH_4$) or other silicon bearing reactant in a low pressure chemical vapor deposition (LPCVD) or plasma enhanced chemical vapor deposition (PECVD) reaction. Excess polycrystalline silicon is removed by CMP to form a permanent gate electrode 84 filling void 82. The material selected for forming permanent gate electrode 84 must have a work function that is capable of fixing an appropriate threshold voltage of the MOS transistor. If the permanent gate electrode is formed of polycrystalline silicon, the polycrystalline silicon can be in situ doped with the appropriate conductivity determining dopant during deposition or can be doped by ion implantation after deposition. The permanent gate electrode can also be formed of a stressed metal or other conductive material providing a stressed metal or other material is selected that has the proper work function to fix the appropriate threshold voltage. In addition, the permanent gate electrode can be formed as a layered structure wherein a bottom layer of the layered structure, such as a layer of polycrystalline silicon, is unstressed and is selected to have the desired work function and an upper layer is a stressed metal or other conductive material. The stressed material can be, for example, stressed titanium nitride. A compressive stressed material is selected for an NMOS transistor gate electrode and a tensile stressed material is selected for a PMOS gate electrode. The layered structure can be fabricated by depositing the first layer into void 82, removing excess first layer material by CMP, etching away a portion of the first layer, replacing the etched away portion of the first layer by depositing the second layer material, and removing excess second layer material by CMP. Using a stressed material as the permanent gate electrode or as a portion of the permanent gate electrode further enhances the stress in the channel.

Although not illustrated, stress enhanced MOS circuit 30 is completed in conventional manner by providing electrical contacts to source 74, drain 76, and permanent gate electrode 84. The conventional processing may include, for example, depositing interlayer dielectrics, etching contact vias, filling the contact vias with conductive plugs, and the like as are well known to those of skill in the art of fabricating semiconductor circuits. In accordance with the various embodiments of the invention described above, stressed dummy gate electrode 44 induces a stress in channel 46 that enhances the mobility of majority carriers in that channel. The induced stress is memorized in the channel by the treatment of the source and drain regions. Permanent gate electrode 84 replaces the stressed dummy gate electrode and is one element in fixing the threshold voltage of the MOS transistor.

Figure 11:
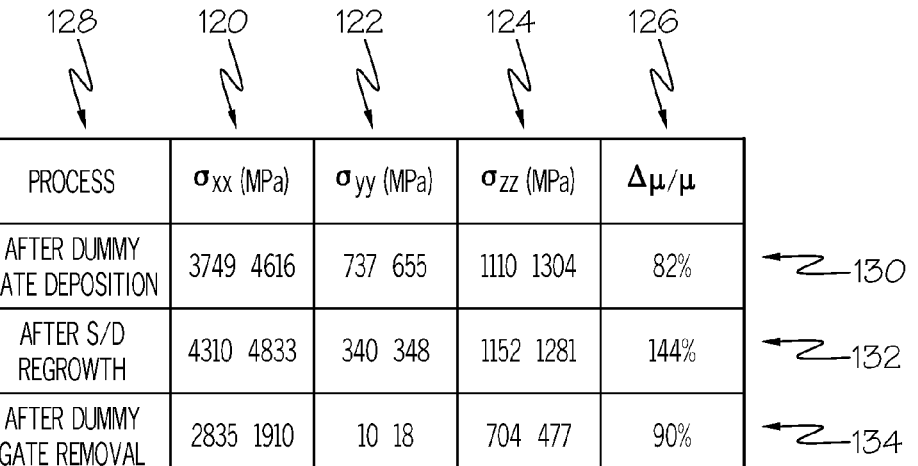
FIG. 11 shows stress simulation and mobility enhancement results at various steps in the method in accordance with embodiments of the invention.

FIG. 11 indicates stress simulation results that show the stress evolution and mobility enhancement results during the process of fabricating an NMOS circuit in the manner just described. The simulation was conducted for an N-channel MOS SOI transistor of an MOS circuit formed in and over a (100) silicon layer having a thickness of 55 nm. The channel of the NMOS transistor was oriented in the [110] direction. The gate oxide was 1 nm in thickness and the gate electrode width was 30 nm with a gate to gate pitch of 130 nm. A compressive stress of −10 GPa was assumed in the titanium nitride dummy gate electrode. Stress was measured in the transistor channel 1 nm below the gate oxide. Two stress measurements were made, one in line with the edge of the gate electrode and one in the center of the channel. The electron mobility (μ) and mobility enhancement (Δμ) were estimated using an average stress in the channel and bulk piezoresistance coefficients. To illustrate how much stress was memorized in the channel after removal of the dummy gate electrode, an assumption was made that there was no stress in the stress liner layer; in reality it is reasonable to assume a tensile stress of 1.2 GPa stress liner layer, and the effect of such stress would be additive to the stress induced by the dummy gate electrode. In FIG. 11 column 120 indicates the resulting longitudinal stress along the channel length, column 122 indicates the resulting vertical stress perpendicular to the channel, column 124 indicates the resulting transverse stress in the channel width direction, and column 126 indicates the mobility enhancement. Column 128 indicates the method step completed. Row 130 indicates the stress and mobility enhancement after deposition of the dummy gate electrode, row 132 indicates the stress and mobility enhancement after source and drain regrowth, and row 134 indicates the stress and mobility enhancement after the removal of the dummy gate electrode. Each of the stress entries shows two values for the simulated stress measurement; the first entry is the simulated stress measurement at the gate edge and the second entry is the simulated stress measurement at the center of the channel. For example, for the entry in column 120 and row 134 the simulated stress measurement at the gate edge is a tensile 2.835 GPa, and the simulated stress measurement at the center of the channel is a tensile 1.910 GPa. As the simulation shows, fabricating an MOS circuit in accordance with an embodiment of the invention results in a majority carrier electron mobility enhancement, even without the beneficial and additive improvement of a stress liner layer, of approximately 1.9 times the value of the mobility of a conventional device.

The foregoing methods for fabricating stress enhanced MOS circuits can be combined with other methods for inducing mobility enhancing channel stress. For example, the trenches in the source and drain regions can be filled with selective epitaxial regrowth of silicon, or they can be refilled with a material that has a different lattice constant than the lattice constant of the channel region. For example, the trenches of an NMOS transistor can be refilled by the selective epitaxial regrowth of silicon mixed with up to about 3% carbon to enhance the longitudinal tensile stress in the channel. Similarly, the trenches of a PMOS transistor can be refilled by the selective epitaxial regrowth of silicon admixed with up to about 30% germanium to enhance the longitudinal compressive stress in the channel.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a stress enhanced MOS circuit comprising a plurality of MOS transistors, each of the MOS transistors comprising a source region, a drain region, and a channel, the method comprising the steps of:
   depositing a stressed material overlying a semiconductor substrate and patterning the stressed material to form a stressed dummy gate electrode overlying a channel, the stressed dummy gate inducing a stress in the channel;
   processing source and drain regions adjacent the channel to maintain the stress in the channel;
   depositing a stress liner overlying the stressed dummy gate electrode;
   removing the stressed dummy gate electrode; and
   replacing the stressed dummy gate electrode with a polycrystalline silicon gate electrode.

2. The method of claim 1 wherein the step of depositing a stressed material comprises the step of depositing a stressed layer of titanium nitride.

3. The method of claim 2 wherein the step of depositing a stress liner comprises the step of depositing a layer of silicon nitride.

4. The method of claim 1 wherein the step of depositing a stressed material comprises the step of depositing a layer of tensile stressed material.

5. The method of claim 1 wherein the step of processing comprises the steps of:
   etching a recess into the semiconductor substrate adjacent the channel; and
   filling the recess with semiconductor material by a process of selective epitaxial growth.

6. The method of claim 1 wherein the step of processing comprises the steps of:
   implanting ions into the semiconductor substrate to form amorphous regions adjacent the channel; and
   recrystallizing the amorphous regions.

7. The method of claim 6 further comprising the step of implanting conductivity determining ions into the recrystallized amorphous regions to form source and drain regions.

8. The method of claim 1 wherein the step of depositing a stressed material comprises the step of depositing a compressive stressed material.

9. A method for fabricating a stress enhanced MOS circuit comprising the steps of:
   depositing a layer of stressed material overlying a semiconductor substrate and patterning the layer to form a stressed dummy gate electrode overlying a channel region in the semiconductor substrate, the stressed dummy gate electrode having a top surface and side surfaces, the stressed dummy gate electrode inducing a stress in the channel region;
   etching first and second recesses into the semiconductor substrate adjacent the side surfaces and the channel;
   filling the first and second recesses by epitaxial growth of a semiconductor material to maintain the stress in the channel region;
   depositing a stress liner overlying the stressed dummy gate electrode;
   exposing the top surface of the stressed dummy gate electrode;
   etching the stressed dummy gate electrode; and
   depositing a gate electrode forming material to replace the stressed dummy gate electrode.

10. The method of claim 9 wherein the step of depositing a layer of stressed material comprises the step of depositing a layer of titanium nitride.

11. The method of claim 9 wherein the step of depositing a stress liner comprises the step of depositing a layer of tensile stressed silicon nitride.

12. The method of claim 11 wherein the step of depositing a layer of stressed material comprises the step of depositing a layer of compressive stressed material.

13. The method of claim 9 wherein the step of depositing a layer of stressed material comprises the step of depositing a layer of tensile stressed material.

14. The method of claim 13 wherein the step of depositing a stress liner comprises the step of depositing a layer of compressive stressed material.

15. A method for fabricating a stress enhanced MOS circuit, the method comprising the steps of:
   depositing a stressed material overlying a semiconductor substrate and patterning the stressed material to form a stressed dummy gate electrode overlying a channel region in the semiconductor substrate, the stressed dummy gate electrode inducing a stress in the channel region;

processing regions of the semiconductor substrate adjacent the channel to maintain the stress in the channel region; and replacing the stressed dummy gate electrode with a permanent gate electrode.

16. The method of claim 15 wherein the step of replacing the stressed dummy gate electrode comprises the step of replacing the stressed dummy gate electrode with a stressed material selected to have a preferred work function to fix a device threshold voltage.

17. The method of claim 15 wherein the step of replacing the stressed dummy gate electrode comprises the step of replacing the stressed dummy gate electrode with a layered structure comprising a first unstressed layer and an overlying stressed layer.

* * * * *